(12) United States Patent
Starr et al.

(10) Patent No.: US 12,553,278 B2
(45) Date of Patent: Feb. 17, 2026

(54) ELECTROMAGNETIC SHIELDING AND ACOUSTIC ATTENUATION DOOR SYSTEM

(71) Applicant: Shielded Opening Solutions, LLC, Sterling, VA (US)

(72) Inventors: James William Starr, Sterling, VA (US); William Hugus, Greensburg, PA (US)

(73) Assignee: Shielded Opening Solutions, LLC, Sterling, VA (US)

( * ) Notice: Subject to any disclaimer, the term of this patent is extended or adjusted under 35 U.S.C. 154(b) by 186 days.

(21) Appl. No.: 18/640,189

(22) Filed: Apr. 19, 2024

(65) Prior Publication Data

US 2024/0352786 A1 Oct. 24, 2024

Related U.S. Application Data

(60) Provisional application No. 63/541,029, filed on Sep. 28, 2023, provisional application No. 63/460,494, filed on Apr. 19, 2023.

(51) Int. Cl.
| | |
|---|---|
| *E06B 5/10* | (2006.01) |
| *E06B 5/20* | (2006.01) |
| *E06B 7/23* | (2006.01) |
| *H05K 9/00* | (2006.01) |

(52) U.S. Cl.
CPC .............. *E06B 5/10* (2013.01); *E06B 5/20* (2013.01); *E06B 7/2316* (2013.01); *H05K 9/0001* (2013.01)

(58) Field of Classification Search
CPC . E06B 5/10; E06B 5/20; E06B 7/2316; E06B 7/22; H05K 9/0001; H05K 9/0007
See application file for complete search history.

(56) References Cited

U.S. PATENT DOCUMENTS

| | | | |
|---|---|---|---|
| 4,287,684 A | 9/1981 | McKann | |
| 5,371,987 A * | 12/1994 | Hirsch | E06B 7/2312 |
| | | | 49/470 |
| 6,600,664 B2 | 7/2003 | Durr et al. | |
| 7,777,435 B2 | 8/2010 | Aguilar et al. | |
| (Continued) | | | |

FOREIGN PATENT DOCUMENTS

KR 101705821 B1 2/2017

OTHER PUBLICATIONS

ISR/WO issued in PCT/US24/25500 on Aug. 1, 2024.

*Primary Examiner* — Gisele D Ford
(74) *Attorney, Agent, or Firm* — The Webb Law Firm

(57) ABSTRACT

An EMI shielding and acoustic attenuation door frame and door system, including: a door connected to a door frame with a hinge, the door including a bottom portion having a plate, a door gasket, a door sponge, and conductive tape for grounding the door; the door frame including: a jamb section including: a jamb main frame; a jamb back frame; wherein the jamb main frame and back frame being adjustable along the wall; a layered jamb gasket at least partially in between the door frame and the jamb main frame; a flanged magnetic jamb gasket fixed to an acoustical retainer with a fastener; wherein the door is grounded when the door is in a closed position against the door frame; a sill section including: a spreader bar having at least one sill gasket covered by a threshold, the spreader bar and at least one sill gasket contacting a floor shielding.

20 Claims, 15 Drawing Sheets

(56) References Cited

U.S. PATENT DOCUMENTS

| | | | |
|---|---|---|---|
| 9,828,798 B1* | 11/2017 | Lahita | E06B 5/18 |
| 11,499,366 B1 | 11/2022 | Palmer et al. | |
| 2003/0174487 A1* | 9/2003 | Garmong | H05K 9/0001 |
| | | | 361/816 |
| 2006/0021784 A1* | 2/2006 | Garmong | H05K 9/0001 |
| | | | 174/100 |
| 2007/0002547 A1* | 1/2007 | Garmong | H05K 9/0001 |
| | | | 361/752 |
| 2013/0047518 A1* | 2/2013 | Van Camp | E06B 7/14 |
| | | | 49/468 |
| 2024/0026731 A1* | 1/2024 | Daut | E06B 1/18 |
| 2024/0218730 A1* | 7/2024 | Daut | E06B 1/52 |

* cited by examiner

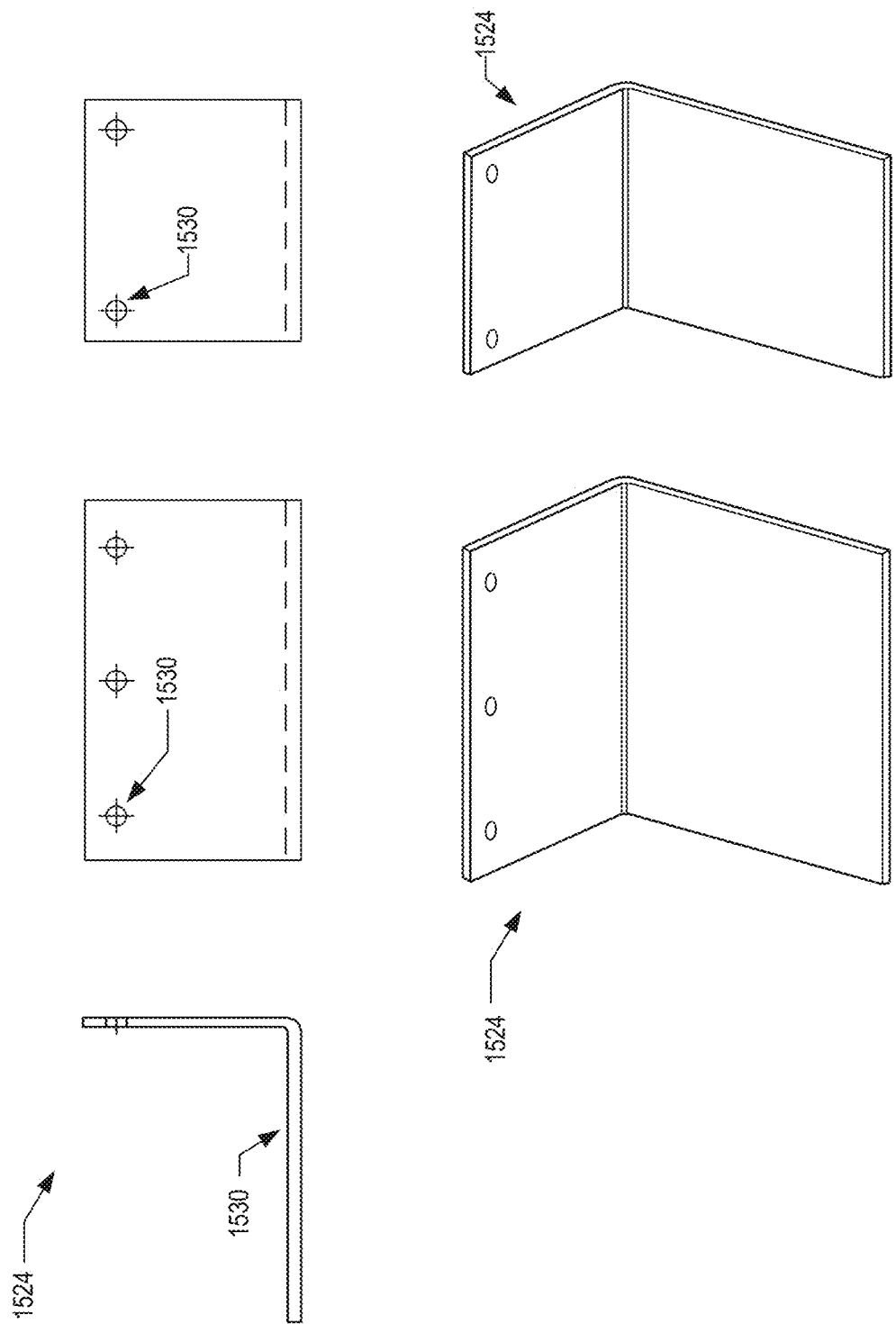

ELECTROMAGNETIC SHIELDING AND ACOUSTIC ATTENUATION DOOR SYSTEM

CROSS-REFERENCE TO RELATED APPLICATIONS

This application claims priority to U.S. Provisional Patent Application No. 63/460,494 filed Apr. 19, 2023 and U.S. Provisional Patent Application No. 63/541,029 filed Sep. 28, 2023, the disclosures of which are hereby incorporated by reference in their entirety.

BACKGROUND OF THE INVENTION

Field of the Invention

This invention relates generally to an Electromagnetic (EMI) shielding and acoustic attenuation door for enclosures and, more particularly, an EMI and acoustic shielding door having improved EMI and acoustic attenuation for a shielded enclosure.

The product is a sound transition class, and frame assembly that has been engineered to provide EMI shielding.

Description of Related Art

Developments continue to be made in EMI shielding and EMI shielded rooms for research, medical, military, and other governmental uses. Enclosures with EMI shielding, in some cases, also require sound attenuation or acoustic insulation in order to protect against the transmission of sound from either within or outside of the shielded enclosure. In production environments, electronics require EMI-noise free areas for testing and other activities, and in medical environments, magnetic resonance images provided by MRI operations are distorted by EMI that emanates from nearby elevator motors, cell phones, television stations, radio stations, and even passing vehicles. In secure EMI shielded environments, there may be a need to keep electronic and/or audio transmissions from exiting the environment or to prevent electronic and/or audio eavesdropping from outside of the shielded enclosure.

EMI and acoustic shielding occurs around the perimeter of the door, namely at the seal and through the door panels. For acoustic purposes, control of the passage of sound waves focuses on the door seal, as well as on the mechanical door for controlling and attenuating the passage of sound waves through the air and also by vibration through materials. Such door designs were developed for applications such as security areas. Generally, these designs teach that to improve sound attenuation properties, it was necessary to increase the sealing of the door. An example is shown in U.S. Pat. No. 5,417,029A.

For EMI purposes, control of the passage of EMI waves focuses on the door seal, as well as on the mechanical door for controlling and attenuating the passage of EMI waves through the air and also through materials. In addition to providing EMI shielding and sound transmission reduction, the door must also be functional, and the EMI and sound attenuation seals must be designed in such a manner that they resist wear or break through use. Moreover, since door alignment is a common problem, any unsealed gaps allow sound, and electromagnetic waves to travel through.

Government requirements require doors and frames to have both sound attenuation and EMI shielding in secure spaces. The current products on the market have a significant lead-time. The current product offerings require a significant amount of force to allow the door to correctly seal against the frame.

SUMMARY OF THE INVENTION

The present disclosure is directed to an improved EMI shielding and acoustic door for shielded enclosures. An object of the present disclosure is to provide an EMI shielding and acoustic door for attenuating EMI radiation and sound attenuation in a myriad of environments, including medical and nonmedical. In addition, an EMI shielding and acoustic door may include an acoustic seal assembly that is adjustable so that a complete seal can be formed around the door head, jamb, and sill. Still further, the present disclosure provides an EMI shielding and acoustic door that provides EMI attenuation and sound attenuation for different frequencies.

Other advantages and features of the invention will be apparent from the following description and from the claims.

In one non-limiting embodiment or aspect of the present disclosure, an EMI shielding and acoustic attenuation door frame and door system includes a door connected to a door frame with a hinge, the door having a bottom portion having a plate, a door gasket, a door sponge, and conductive tape for grounding the door; the door frame having a jamb section having a jamb main frame; a jamb back frame; where the jamb main frame and back frame being adjustable along the door frame; a layered jamb gasket at least partially in between the hinge and the jamb main frame; a flanged magnetic jamb gasket fixed to an acoustical retainer with a fastener; where the door is grounded when the door is in a closed position against the door frame; a sill section having: a spreader bar having at least one sill gasket covered by a threshold, the spreader bar and at least one sill gasket contacting a floor shielding; and a door head section having the conductive tape contacting a head EMI gasket, the head EMI gasket fixed to a head main frame; wherein the head EMI gasket at least partially contacts the door when the door is in a closed position.

In another non-limiting embodiment or aspect of the present disclosure, where the jamb section further includes a jamb EMI retainer adjustably fixed to the jamb main frame, the jamb EMI retainer configured for the jamb EMI gasket to be fixed to; and the head section further having a head retainer frame adjustably fixed to the head main frame, the head retainer frame configured for a head acoustical gasket to be fixed to therein; and a head cover, the head cover adjustably fixed to the head back frame.

In another non-limiting embodiment or aspect of the present disclosure, where the jamb EMI gasket is a layered gasket having three layers which contact the jamb main frame and the door.

In another non-limiting embodiment or aspect of the present disclosure, further including a bolt which fixes the door frame to a wall, the bolt inserted at least partially in the wall and through the door frame.

In another non-limiting embodiment or aspect of the present disclosure, the hinge rotatably fixing the door to the frame is a cam lift hinge.

In another non-limiting embodiment or aspect of the present disclosure, the jamb back frame is adjustable such that the jamb main frame is secured to a wall.

In another non-limiting embodiment or aspect of the present disclosure, the door EMI gasket and the door sponge at least partially contact the threshold when the door is in the closed position.

In another non-limiting embodiment or aspect of the present disclosure, the door EMI gasket is at least partially in between a steel plate and the door sponge.

In another non-limiting embodiment or aspect of the present disclosure, the door EMI gasket is a two-piece layered gasket.

In another non-limiting embodiment or aspect of the present disclosure, an EMI shielding and acoustic attenuation door frame, includes a door jamb section including: a main door frame fixed to a wall, a jamb back frame adjustably fixed to the main frame and a jamb EMI retainer, the jamb EMI retainer adjustably fixed to the jamb main frame; a jamb acoustic gasket in between the main frame and an acoustic retainer fixed to the main frame; and a flanged magnetic gasket fixed to the acoustic retainer and grounded to the jamb EMI acoustic gasket through a conductive tape; where the conductive tape is fixed to the door and main door frame; a jamb section including: a jamb main frame; a jamb back frame; wherein the jamb main frame and back frame being adjustable along the door or wall; a layered jamb gasket at least partially against the jamb main frame; a door sill section including: a spreader bar having at least one sill gasket in between a threshold and a floor surface; and a door head section including: a door head frame including a head back frame and a head retainer cover adjustably fixed to the head main frame; and the conductive tape at least partially contacting a head gasket; a flanged magnetic head gasket fixed to head retainer cover and fixed to the conductive tape.

In another non-limiting embodiment or aspect of the present disclosure, a door rotatably connected to the door frame with at least one hinge, the door having a bottom portion having a plate, a door gasket, a door sponge, and the conductive tape.

In another non-limiting embodiment or aspect of the present disclosure, when the door is in a closed position, the jamb gaskets and the head gaskets at least partially contact the door.

In another non-limiting embodiment or aspect of the present disclosure, the door gasket and the door sponge contact the threshold when the door is in the closed position.

In another non-limiting embodiment or aspect of the present disclosure, the door gasket separates the plate and the door sponge.

In another non-limiting embodiment or aspect of the present disclosure, the door gasket is a layered gasket.

In another non-limiting embodiment or aspect of the present disclosure, the jamb gasket is a layered gasket having three layers which contact the jamb retainer frame and a door.

In another non-limiting embodiment or aspect of the present disclosure, the head retainer frame configured for the jamb gasket to be fixed therein, located between a retainer cover and a wall.

In another non-limiting embodiment or aspect of the present disclosure, a fastener which fixes the door frame to a wall, the fastener inserted at least partially in the wall and through the door frame.

In another non-limiting embodiment or aspect of the present disclosure, the hinge rotatably fixing a door to the frame is a cam lift hinge.

In another non-limiting embodiment or aspect of the present disclosure, the jamb back frame being adjustable such that the main frame may be secured to the wall and the main frame.

Advantageously, the frame and sections which make up the gasketing system are fully adjustable to allow for variation in the construction of the wall to obtain EMI shielding.

Advantageously, the gaskets included are adjustable to account for variations in the construction and for variations in floor conditions to mitigate EMI leaks under the threshold.

Advantageously, the one-half inch stainless steel thresholds allow the door bottom additional clearance over the finished floor (i.e. the carpet or flooring material).

Advantageously, the permeant spreader bar under the threshold makes the threshold more resistant to being crushed when heavy equipment is taking through the assembly. It also helps resist the door frame twisting during installation.

BRIEF DESCRIPTION OF THE DRAWINGS

Other features, advantages, and details of the present invention will emerge on reading the following description of several embodiments of the invention given by way of illustration and not being limiting, said description being made with reference to the appended drawings.

FIG. 15a displays an isometric view and a top view of a closer L bracket; and

FIG. 15b displays an isometric view and a top view of a strike L bracket.

DESCRIPTION OF THE INVENTION

Characteristics of the present invention, as well as the methods of operation and functions of the related elements of structures and the combination of parts and economies of manufacture, will become more apparent upon consideration of the following description with reference to the accompanying drawings, all of which form a part of this Specification. It is to be expressly understood, however, that the drawings are for the purpose of illustration and description only, and are not intended as a definition of the limits of the invention. As used in the Specification and the claims, the singular form of "a," "an," and "the" include plural referents unless the context clearly dictates otherwise. It is to be understood that the specific devices and processes illustrated in the attached drawings, and described in the following Specification, are simply exemplary embodiments of the invention. Hence, specific dimensions and other physical characteristics related to the embodiments disclosed herein are not to be considered as limiting.

Referring to the figures, wherein like numerals of reference designate like elements throughout the several views, an Electromagnetic frequency (EMI) and acoustic shielding door 10 having improved EMI and acoustic attenuation for a room entry way is illustrated. The shielding door 10 is designed for commercial and security applications, and it provides the opening and closing forces associated with a conventional shielding room entryway door. In addition, the shielding door 10 may include deadbolts, door closers, magnetic switches, medium or high security combination locks, or other specified door hardware to suit the particular application. Conductive tape may be applied throughout the sections of the system. Conductive tape is used to increase the grounding capabilities of the system.

Figure 1:
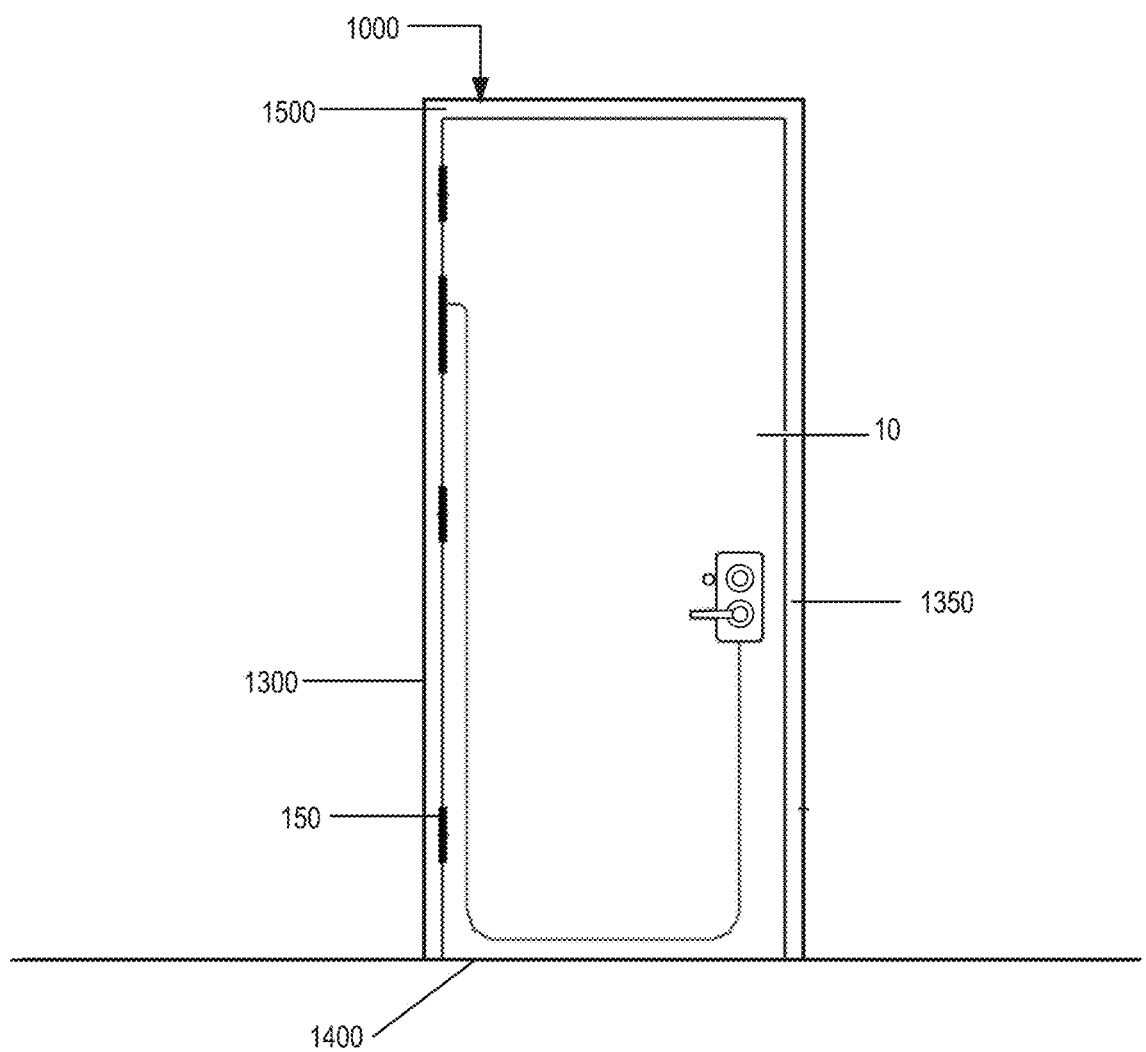
FIG. 1 displays an elevation view of an example of a door.

FIG. 1 displays a shielding door 10 within a door frame including at least one door hinge 150 that is hingedly or rotationally attached to a door frame 1000, which may be a portion of the wall of the room to which the shielding door 10 is mounted or rotationally fixed to by the door hinge 150. The door hinge 150 may have a first leaf 104 and a second leaf 105. The door 10 is mounted to the door frame 1000 using the hinge 150 that is designed and installed to ground the door 10. The shielding door 10 is illustrated as a single door, but is not so limited; the shielding door 10 can be constructed as a double door. The shielding door 10 may also include an electric power transfer or any similar power transfer system. The shielding door 10 may also include a handle and lock attached to the power transfer. As shown in FIG. 1, an electric conduit may connect the electric power transfer to the door handle. This allows for the shielding door 10 to be electrically locked or unlocked. The door frame 1000 may be made of a head section 1500, jamb sections 1300, and the sill section 1400.

Figure 2:
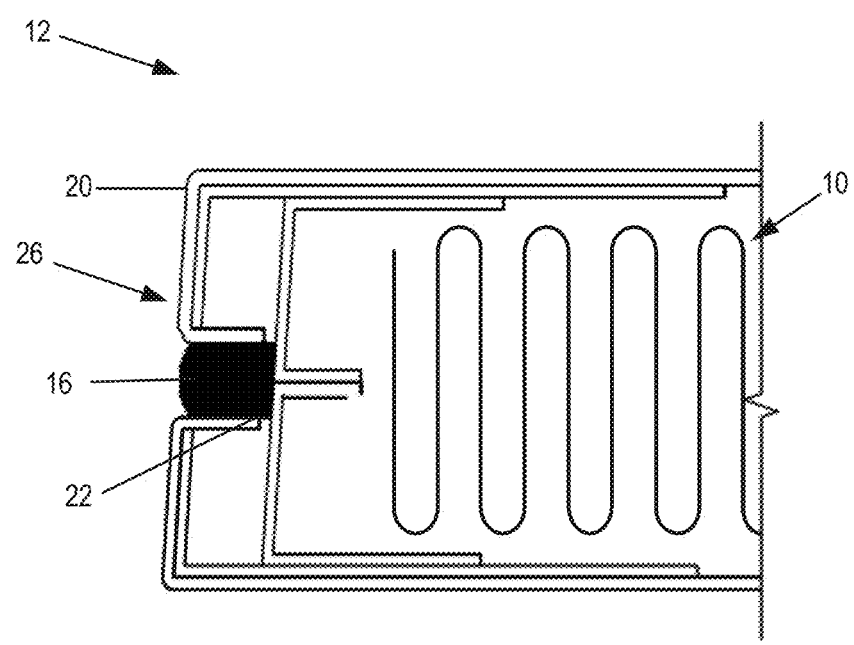
FIG. 2 displays a section view of an example of an edge of the door.

FIG. 2 displays a cross-section of an edge assembly 12 of the shielding door 10 and includes at least one acoustic or EMI attenuator or cover strip 16. The edge assembly 12 of the shielding door 10 includes a sound isolator or attenuator strip 16 nested in the side portion 20 of the shielding door 10. The edge assembly 12 may have a general U-shaped notch 22 where the attenuator strip 16 is nested. The isolator strip 16 may be made of solid neoprene or a similar material with similar sound dampening features. The side portion 20 of the edge assembly 12 couples the isolator strip 16 to the side of the shielding door 10. The edge assembly 12 may span the sides of the shielding door 10 and up to a head section. The edge assembly 12 contacts the door frame 1000 and may be in sealed contact with the door frame 1000 or door frame gasketing when the shielding door 10 is closed. The edge assembly 12 may span to an upper corner of the door frame 1000 which may be in sealed contact with the head section 1500 of the door frame 1000, which is in sealed contact with the shielding door 10 when the shielding door 10 is in the closed position. Preferably, the door frame 1000 contacts a jamb section 1300. A lower edge assembly 12 may span to the bottom of the shielding door 10 and makes sealed contact in a corner of the door frame 1000 with the sill section 1400. Each of the edge assemblies 12 tolerances are adjustable so that a complete seal can be formed around the head section 1500, the hinge jamb sections 1300, strike jamb sections 1350, and the sill section 1400 of the door frame 1000 since door alignment is a common problem and any unsealed gaps allow sound and EMI to travel through the shielding door 10.

Figure 3:
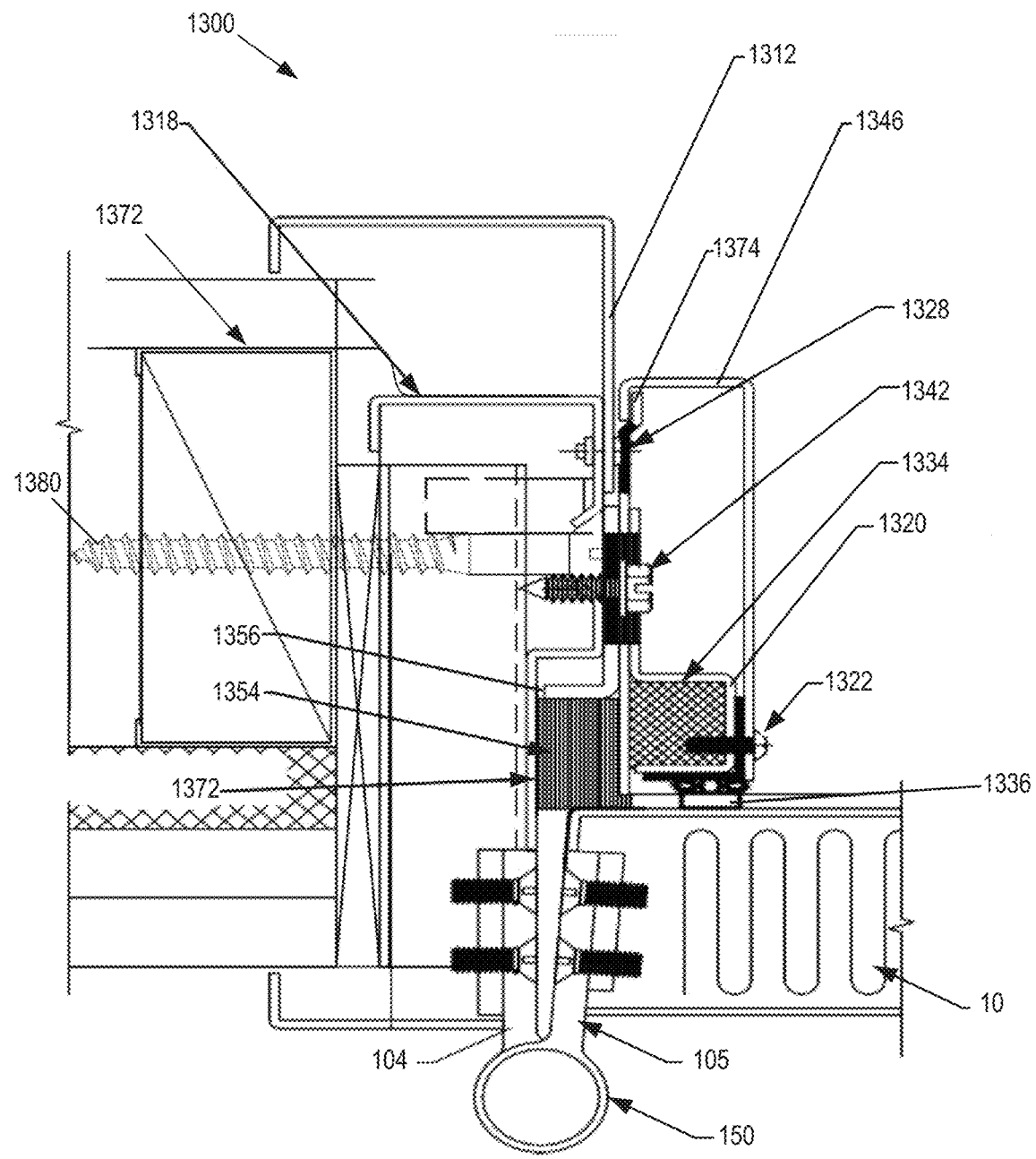
FIG. 3 displays a section view of an example of a hinge jamb section.
Figure 4:
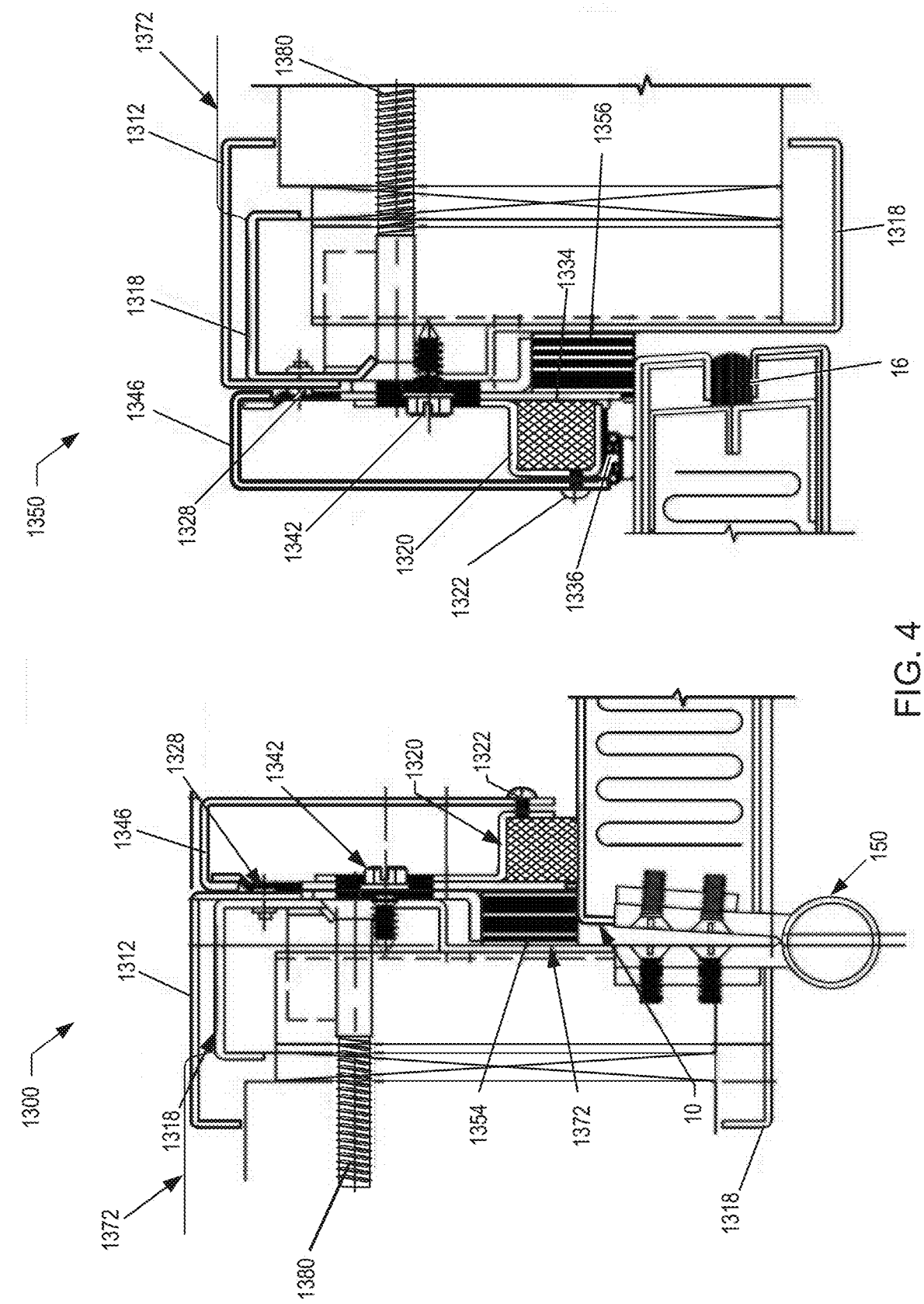
FIG. 4 displays a section view of another example of a hinge jamb with a strike jamb.

FIGS. 3 and 4 display an example of a cross section of the jamb section 1300 of the door frame 1000. The jamb section 1300 includes a back frame 1312 and a main frame 1318 which are fixed to the wall via an attachment means. The attachment means may include a bolt, screw, nail, rivet, or similar means.

The main frame 1318 is configured to attach to the jamb section 1300 or wall and provide attachment point for at least the back frame 1312, an acoustical retainer 1320, a retainer cover 1346, and an EMI retainer 1356. An attachment means being a screw or rivet 1328, attaches the main frame 1318 and the back frame 1312. Screw or bolt 1380 connects the main frame to the wall.

The main frame 1318 is configured to provide attachment point for at least the acoustical retainer 1320 and retainer cover 1346. The back frame 1312 may mostly visibly hide the non-door side of the main frame 1318. The acoustical retainer 1320 is configured to hold an acoustical gasket 1334 and may include a magnetic seal 1336. The acoustical retainer 1320 is attached to the main frame 1318 by a retainer screw 1342. The EMI retainer 1356 is configured to hold a jamb EMI gasket 1354. The EMI retainer 1356 is attached to the main frame 1318 by a retainer screw 1342. The retainer cover 1346 may be configured to hold a flanged magnetic gasket 1336 between the retainer cover 1346 and the acoustical retainer 1320. The retainer cover 1346 is attached to the acoustical retainer 1320 by a retainer cover screw 1322.

The flanged magnetic gasket 1336 may be made of a rubber like material with an internal magnet and be configured to have grounding or insulating properties. The flanged magnetic gasket 1336 may create a flanged magnetic seal when in contact with the door 10 to further increase the EMI shielding properties and acoustical attenuation properties. The flanged magnetic gasket 1336 may adjustably rest between the door 10 and the acoustical retainer 1320. A double sided adhesive tape may connect the flanged magnetic gasket 1336 to the acoustical retainer 1320. The flanged magnetic gasket 1336 separates the retainer cover 1346 and the retainer 1320. The flanged magnetic gasket 1336 may also contact the door 10 when the door 10 is in the closed position.

The acoustical gasket 1334 may be configured to be inserted in a section of the acoustical retainer 1320. The acoustical gasket 1334 may further insulate the jamb section 1300 and aid in increasing the acoustic attenuation. The acoustical gasket 1334 may be a neoprene sponge or any other similar material for dampening. The acoustic gasket 1334 may be coupled to the acoustical retainer 1320 by double-sided adhesive and the retainer cover screw 1322.

The jamb EMI gasket 1354 is configured to be inserted in between the jamb 1300 and EMI retainer 1356 such that at least a section of the EMI gasket 1354 is able to contact the door 10. The jamb EMI gasket 1354 may insulate or ground the shielding door 10 when the door 10 is in a closed position by contacting the door 10. The jamb EMI gasket 1354 may be on the strike jamb side and may seal the door 10 when the door 10 is in the closed position. The jamb EMI gasket 1354 would then be a strike jamb EMI gasket 1354 and contact the door 10 when the door 10 is in the closed position. The jamb EMI gasket 1354 or strike jamb EMI gasket 1354 may be made of multiple layers, which may increase the audible seal and EMI shielding between the jamb section 1300 and the door 10.

Preferably, the EMI gasket 1354, the acoustical gasket 1334, and the flanged magnetic gasket 1336 are in a layered position from the door frame 1000. The acoustical gasket 1334 may be at least partially covered by the acoustical retainer 1320. The acoustical gasket 1334 and the jamb EMI gasket 1354 preferably are not in contact, and separated by the EMI retainer 1356. The retainer cover screw 1322 may connect through any one of or all of the retainer cover 1346, flanged magnetic gasket 1336, and/or acoustical gasket 1334. Further, the EMI retainer 1356 and acoustical retainer 1320 may be adjustably attached to the main frame 1318.

Advantageously, the jamb EMI gaskets 1354 included are adjustable by adjusting the EMI retainer 1356 to account for variations in the construction and for variation in floor and wall conditions to mitigate EMI leak. Advantageously, the frame 1000 and jamb sections 1300, which are included in the system, are fully adjustable to allow for variation in the construction of the wall to obtain better acoustical and EMI shielding because of the main frame 1318, back frame 1312, and retainer cover 1346 configuration. Additionally, the gaskets of the system are sized and shaped to allow for variances in the adjustments of the sections. The points of attachment where the retainer cover screw 1322, back frame screw 1328, and retainer screw 1342 fix the retainer cover 1346 and main frame 1318 to allow for adjustment of back frame 1312 and main frame 1318 to account for inconsistences in the shape and surface of the walls and frames. The retainer cover screw 1322, back frame screw 1328, and retainer screw 1342 may be any fastening means.

The hinge 150 may rotatably fix the door 10 to the jamb section 1300. The hinge 150 may be a cam-lift style hinge or a similar hinge type. Preferably, the hinge 150 includes a neoprene compression seal hinge jamb in lieu of a magnetic seal to prevent the magnetic seal from rolling where the door 10 could contact the jamb EMI gasket 1354. The hinge 150 may be bolted or screwed to the jamb section 1300 and door 10, such that when the door 10 is in the closed position, the door 10 at least partially contacts the flanged magnetic gasket 1336 and/or the EMI gasket 1354.

Advantageously, conductive tape 1372 may be applied to the main frame 1318 and each conductive surface to ground the door 10 and frame 1000 to attenuate EMI transmission. Conductive tape 1372 may be applied to all sides of the frame 1000. Conductive tape 1372 may include a mask and peel style tape and EMI foil. The conductive tape 1372 is applied prior to priming a surface for application, adding a wall shielding material such as aluminum foil to the frame or surface, and then applying the tape. This electrically bonds the materials that the tape 1372 is applied to for grounding, such as, but not limited to, the jamb EMI gasket 1354.

Figure 5:
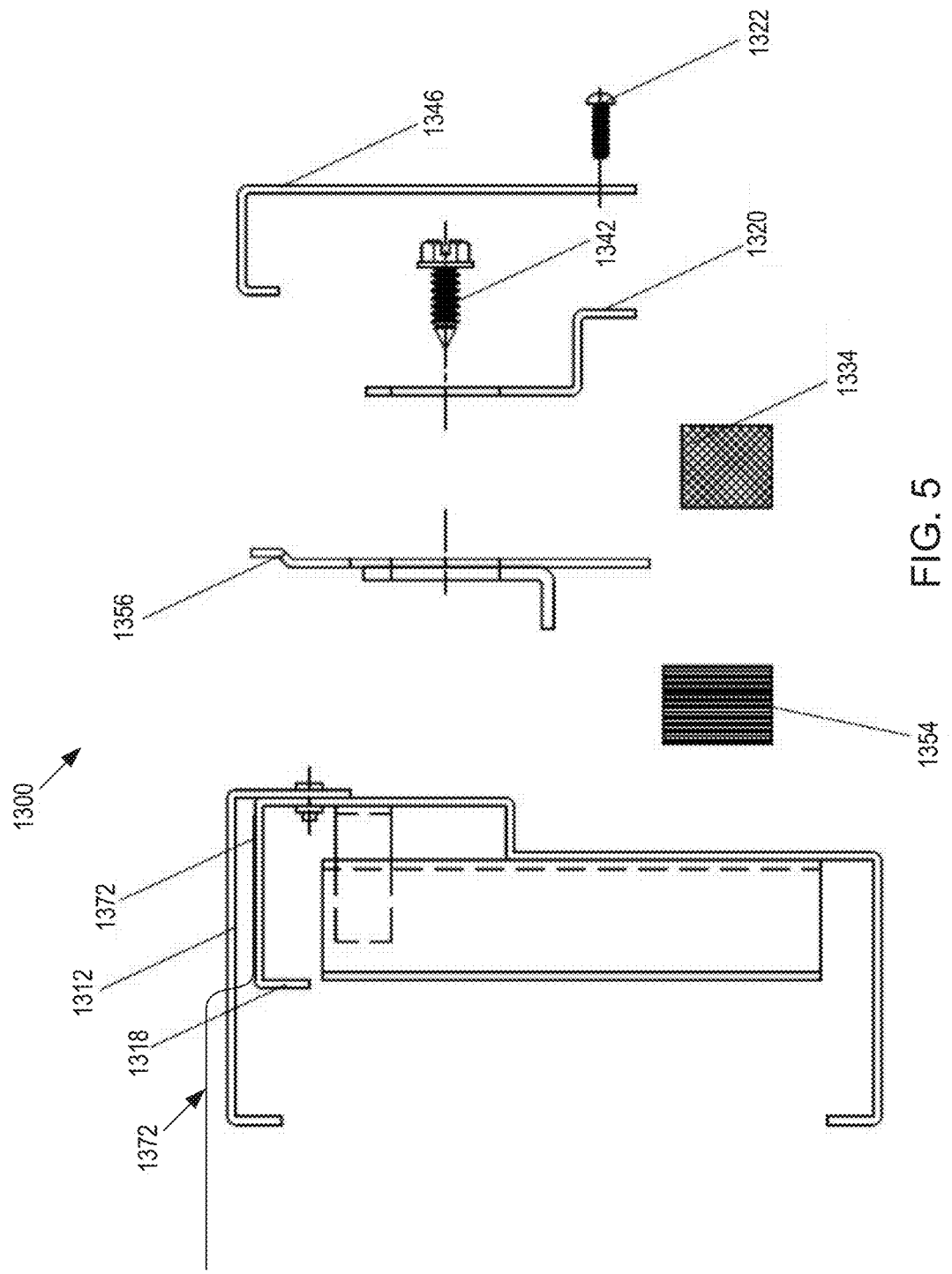
FIG. 5 displays an exploded section view of an example of a hinge jamb section.
Figure 6:
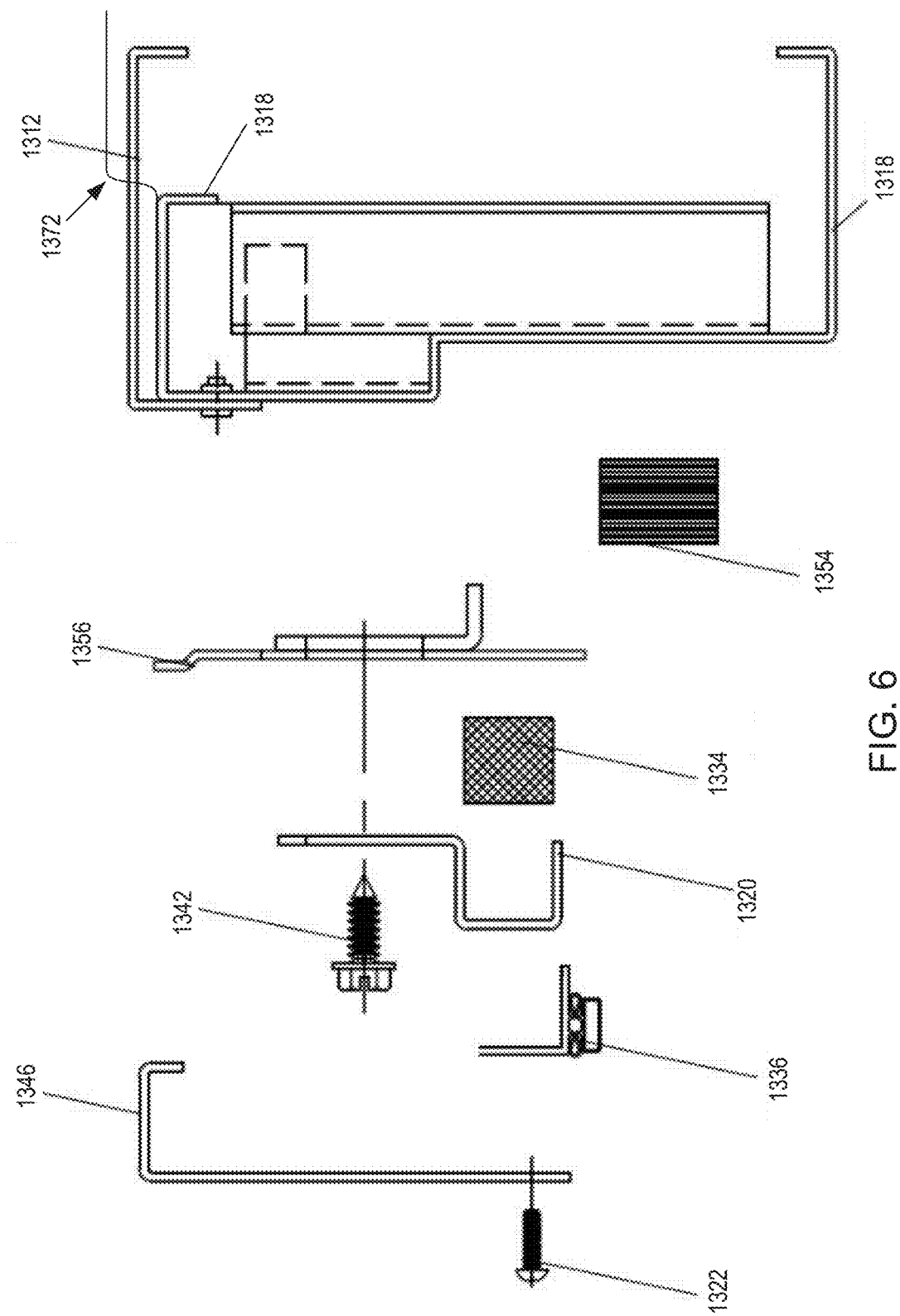
FIG. 6 displays an exploded section view of an example of a strike jamb section.

Further, FIGS. 4-6 display a cross section view of another embodiment of a hinge jamb and a respective strike jamb section 1350. The strike jamb section 1350, may be similar to the hinge jamb section 1300 and include a back frame 1312 and a main frame 1318 which are fixed to the wall via an attachment means. The attachment means may include a bolt, screw, nail, rivet, or similar means. This attachment means anchors the strike jamb section 1350 to the wall. The retainer screw 1322 may attach the acoustical retainer 1320 to the wall. It is noted that the disclosure of the hinge jamb section 1300 may be similar to the disclosure of the strike jamb section 1350.

The back frame fastener 1328, attaches the back frame 1312 to the main frame 1318. The main frame 1318 is fastened to the wall by the wall anchor screw 1380.

A retainer cover 1346, covering the back frame screw 1328 or fastening means and the retainer screw 1342 is connected to the main frame 1318 by retainer cover screw 1322. The acoustical retainer 1320 is fastened to the strike jamb section 1350 opposite the jamb hinge section 1300 having the hinge 150. The retainer cover screw 1322 may connect through any one of or all of the retainer cover 1320, flanged magnetic gasket 1336, and acoustic gasket 1334.

Coupled to the main frame 1318 by retainer cover screw 1342 and double sided adhesive tape is a flanged magnetic gasket 1336. Similarly, the flanged magnetic gasket 1336 may also be on the strike jamb section 1350. The flanged magnetic gasket 1336 may contact the door 10 to further increase the EMI shielding properties and acoustic properties. The flanged magnetic gasket 1336 separates the retainer cover 1346 and EMI retainer 1356. The flanged magnetic gasket 1336 may also contact the door 10 when the door 10 is in the closed position. The flanged magnetic gasket 1336 may have grounding or insulating properties. Between the acoustical retainer 1320 and the main frame 1318 are a jamb EMI gasket 1354 and acoustic gasket 1334. The jamb EMI gasket 1354 may insulate or ground the shielding door 10 when the door 10 is in a closed position by contacting the door 10. The jamb EMI gasket 1354 may seal the door 10 when the door 10 is in the closed position. The jamb EMI gasket 1354 may be made of multiple layers, which may increase the audible or EMI seal between the strike jamb section 1350 and the door 10. The acoustic gasket 1334 may be nested between the wall and the acoustical retainer 1320 or the flanged magnetic gasket 1336, but is preferably between the acoustical retainer 1320 and the EMI retainer 1356. The acoustic gasket 1334 may further insulate the strike jamb section 1350 and aid in increasing the acoustic attenuation by reducing sound transmission between the EMI retainer 1356 and the acoustical retainer 1320. The acoustic gasket 1334 may be a neoprene sponge or any other similar material for dampening.

Advantageously, on the hinge jamb section 1300 the acoustic gasket 1334 is adjustable with the EMI retainer 1356 to account for variations in the construction and for variation in wall conditions to mitigate EMI leak. Advantageously, the frame 1000 and strike jamb sections 1350, which are included in the system, are fully adjustable to allow for variation in the construction of the wall to obtain EMI shielding because of the main frame 1318 and EMI retainer 1356 configuration. Additionally, the gaskets of the system are sized and shaped to allow for variances in the adjustments of the sections. The points of attachment where the retainer cover screw 1322, back frame screw 1328, and retainer screw 1342, or any attachment means, fix the EMI gasket retainer 1356 and back frame 1312 allow for adjustment of frames 1312, 1318 to account for inconsistencies in the wall and frame. Advantageously, the main frame 1318 and back frame 1312 are configured to allow for adjustability.

Figure 7:
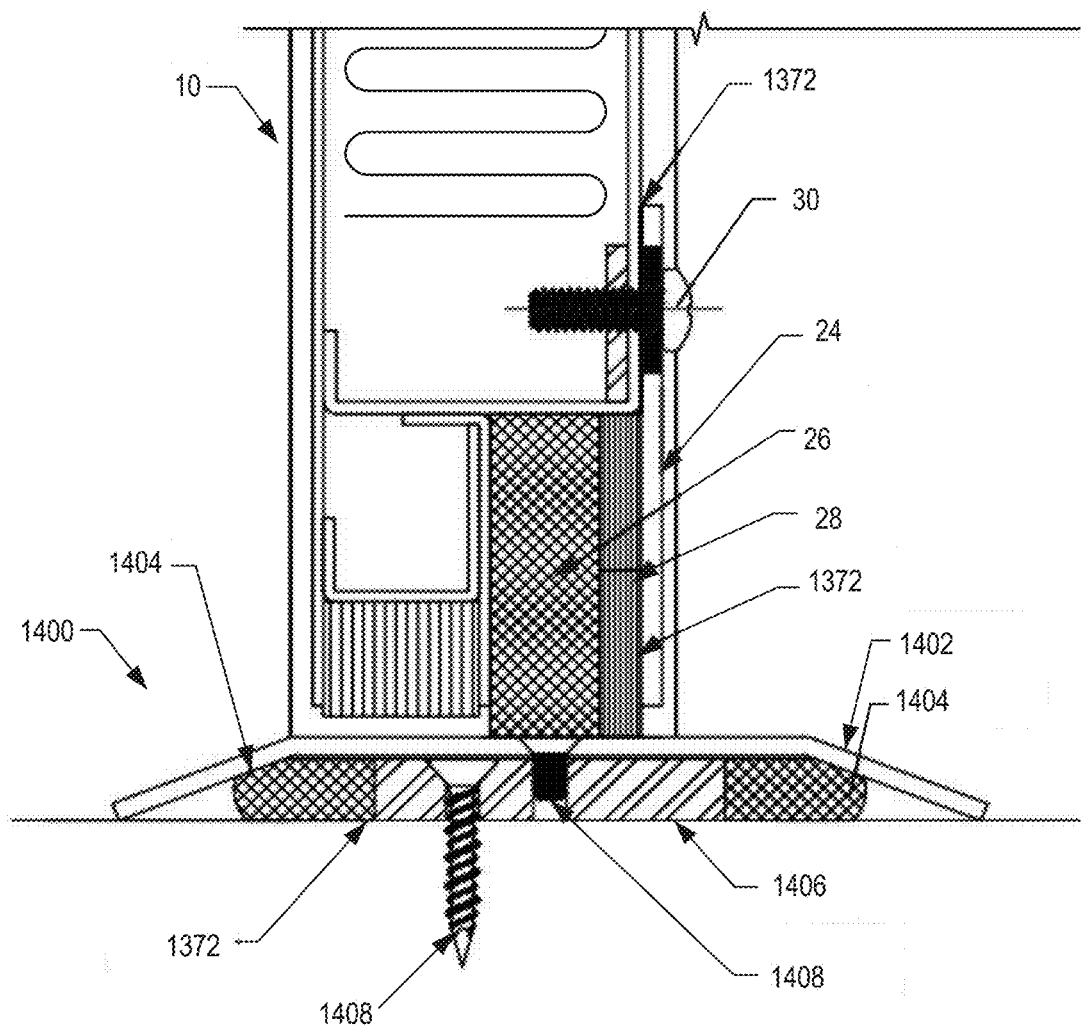
FIG. 7 displays a section view of an example of a sill section.
Figure 8:
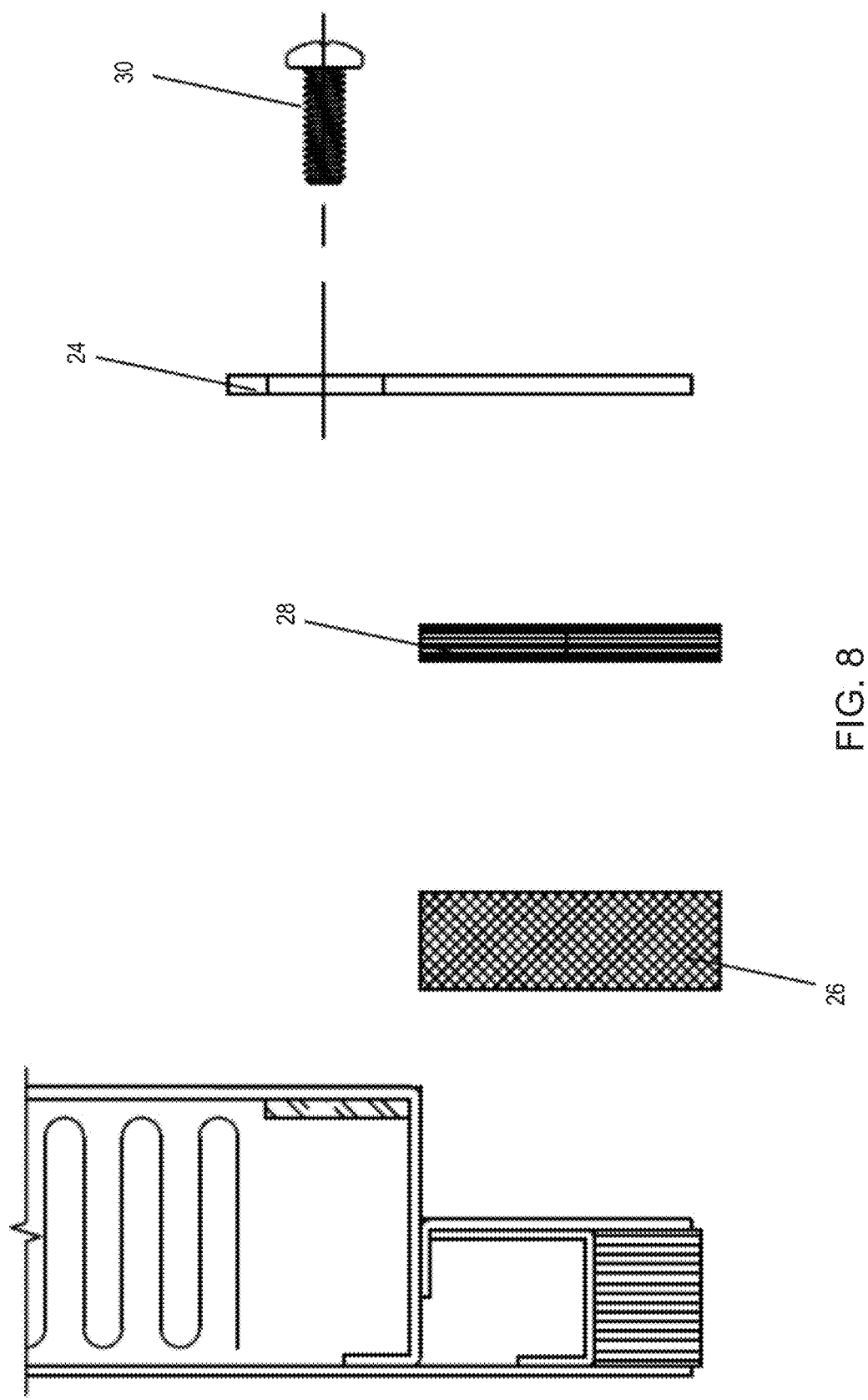
FIG. 8 displays an exploded section view of an example of a door bottom.
Figure 9:
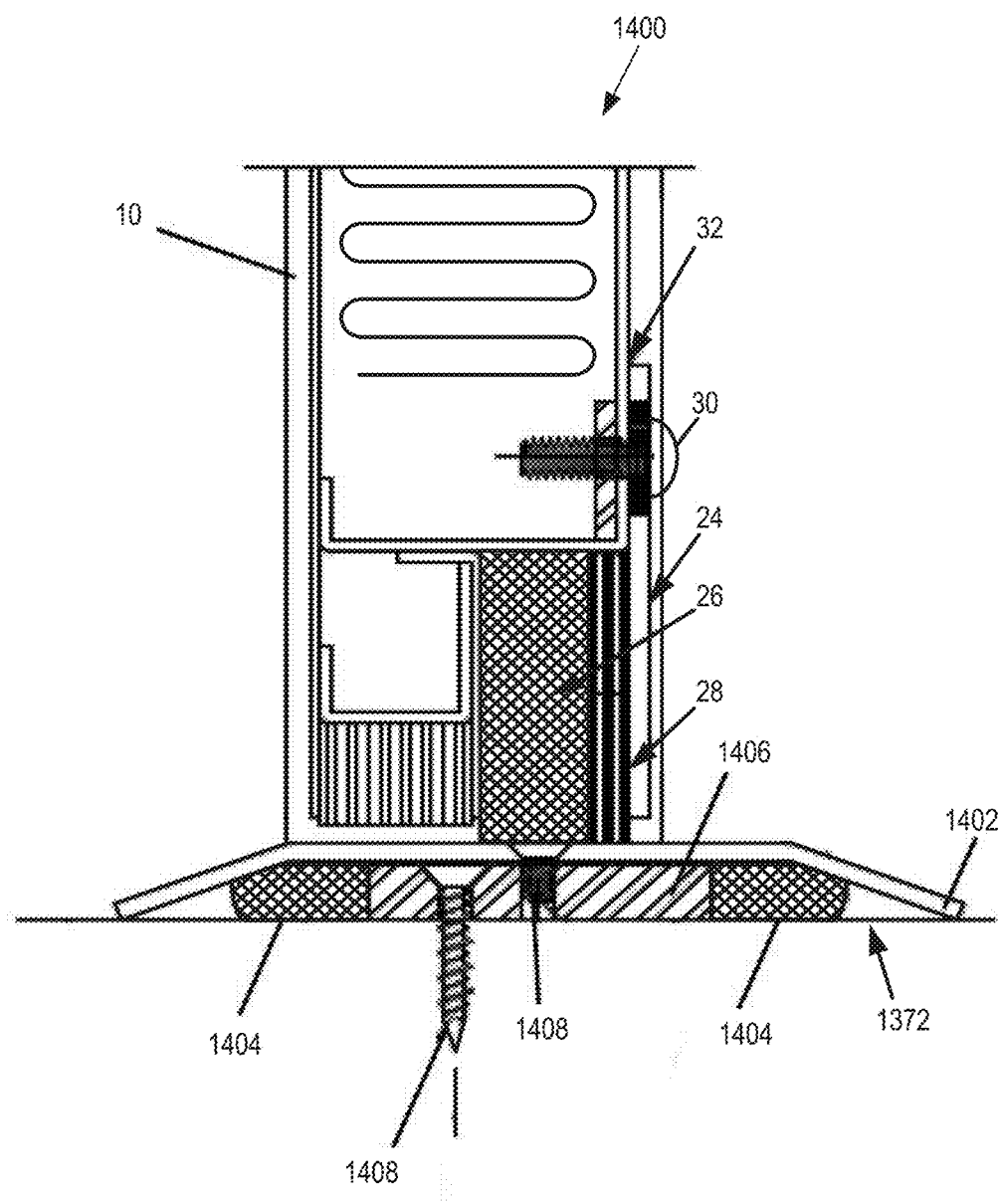
FIG. 9 displays a section view of another example of a sill section.
Figure 10:
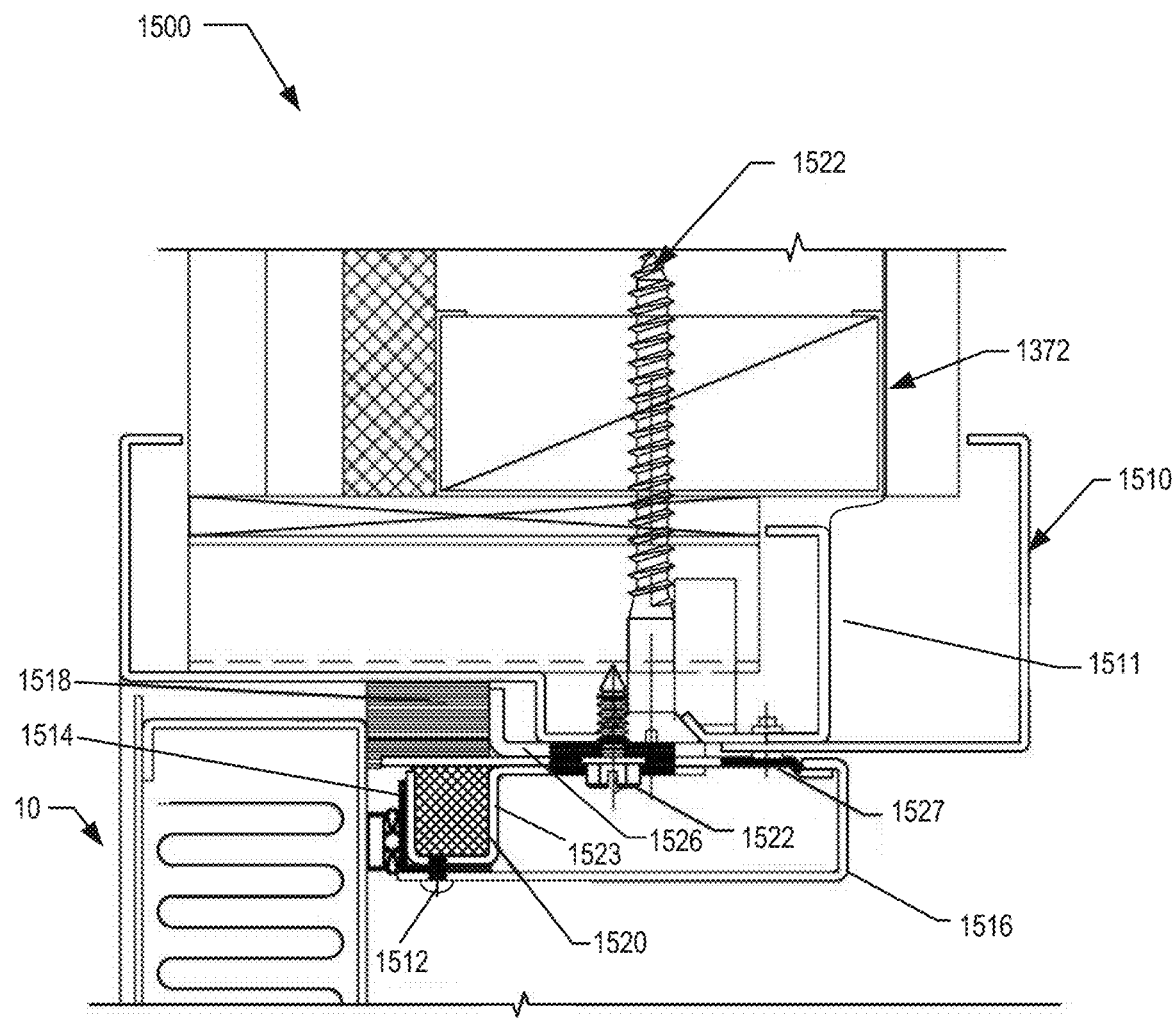
FIG. 10 displays a section view of an example of a head section.
Figure 11:
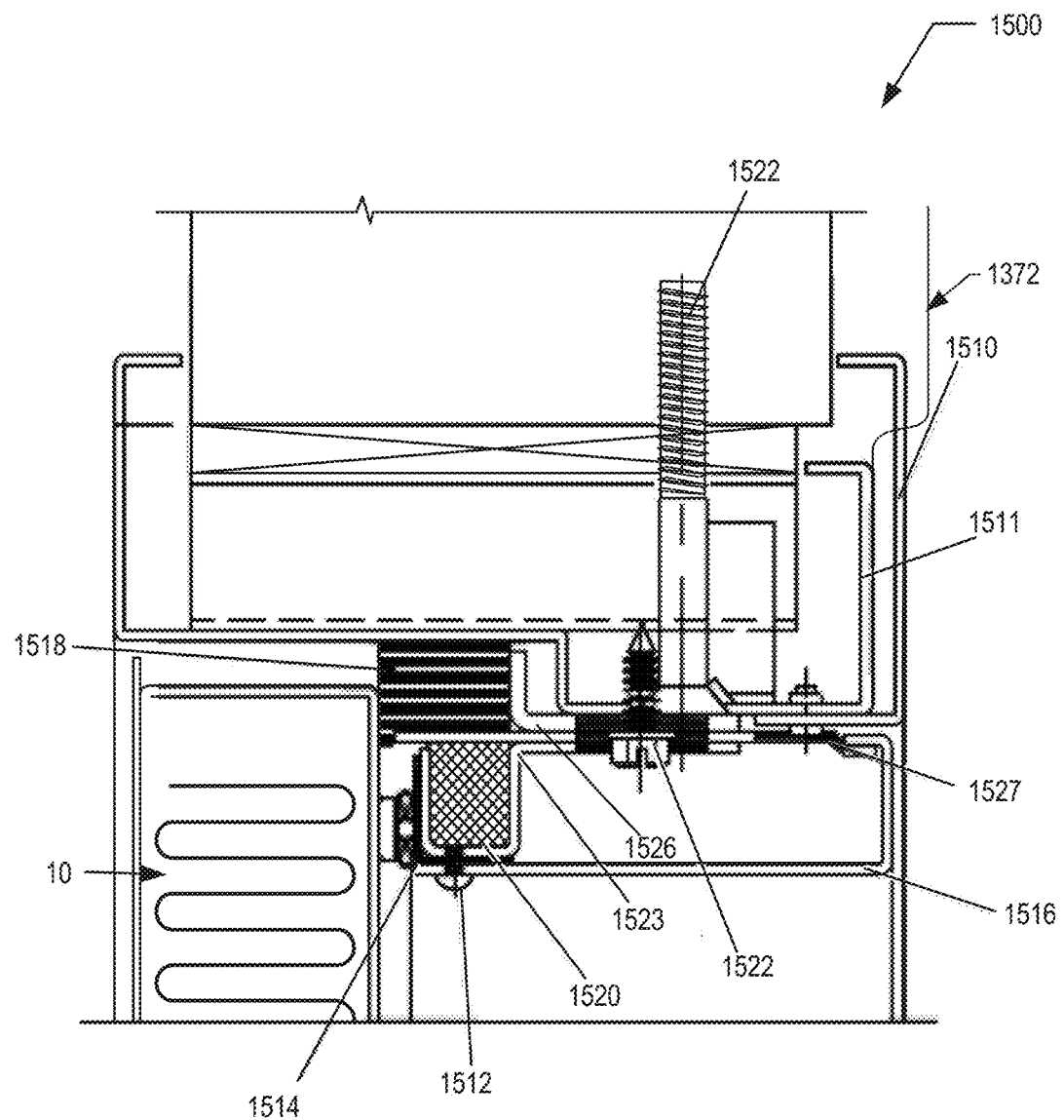
FIG. 11 displays a section view of another example of a head section.

FIGS. 7-9 display a cross-section of the sill section 1400 of the door 10 and door frame 1000. The sill section 1400 includes a threshold 1402 which is fixed to the ground or floor surface. The threshold 1402 may be configured such that the bottom of the door 10 contacts the top surface of the threshold 1402 and a cavity or chamber below the bottom surface of the threshold 1402 and floor surface exists. The threshold 1402 may be substantially flat otherwise. The threshold 1402 may be made of any material that allows for conductive grounding.

The sill section 1400 may further include EMI gaskets 1404 and a spreader bar 1406. The threshold 1402 covers and compresses the EMI gaskets 1404 and the spreader bar 1406. The EMI gaskets 1404 may surround the spreader bar 1406 on at least two sides. The EMI gaskets 1404, not being limited in number, further may help to dampen sound, EMI attenuation, and insulate the sill section 1400. The threshold 1402 may be fixed directly to the ground or floor surface through the spreader bar 1406. The spreader bar 1406 may itself be fixed to the ground or floor surface by screws or floor anchors 1408. The spreader bar 1406 may be made of any common spreader bar material.

Conductive tape 1372 or foil may be placed in a layer of the floor surface to further ground the sill section 1400. The cam action hinges 150 may allow the door 10 to rise above floor covering as the door opens as desired and lower the door 10 onto the threshold when in a shut position to create a better acoustical and EMI seal. Advantageously, the permeant spreader bar 1406 under the threshold 1402 makes the threshold 1402 more resistant to compressive forces when heavy equipment is taken over the threshold. It also aids to resist twisting the door frame 1000 during installation. FIG. 9 further displays another example of a sill section.

Further, FIGS. 7-9 display examples of the bottom of the door 10. The bottom of door 10 may include a plate 24 which extends from the bottom of the door 10 towards the threshold 1402. The plate 24 may fix the STC and EMI gasketing that contacts the threshold 1402 when the door 10 is in the closed position. The plate 24 may be made of steel, stainless steel, or another similar conductive material. The plate 24 may be fastened to the door 10 with a screw or fastener 30. The fastener 30 may be adjustable with the plate 24 to allow for the plate 24 to be raised or lowered to a desired height. The plate 24 may be slotted to allow for adjustment.

An acoustic gasket 26 and EMI gasket 28 may extend from the bottom of the door 10 adjacent to the plate 24. The acoustic gasket 26 and EMI gasket 28 may contact the threshold 1402 and further aid in dampening sound. The EMI gasket 28 may be a multilayered gasket or a multitude of gaskets in a stacked formation. Conductive tape 1372 may be applied to the bottom of the door 10 to further electrically ground the door 10 to the door bottom. The conductive tape 1372 may be applied to other sections of the door 10. Conductive tape 1372 may advantageously be applied in between the plate 24 and the EMI gasket 28 and further at the bottom of the door 10 where the plate 24 is fastened to the door 10.

FIGS. 10-13 display a cross section of the head section 1500 of the door frame 1000. The head section 1500 may be a similar structure to the strike jamb section 1350. The head section 1500 may include a main frame 1511 which is fixed to a back frame 1510 and the wall or ceiling via an attachment means 1522. The attachment means 1522 may include a bolt, screw, nail, rivet, or similar means. This attachment means anchors the head section 1500 to the wall. The back frame 1510 is attached to the main frame 1511 by a screw or fastener 1527. The EMI Gasket 1518 is attached to the main frame 1511 by a screw or fastener 1522.

Coupled to the acoustical retainer 1523 by a retainer cover screw 1512 is a flanged magnetic gasket 1514 used to insulate against acoustics. A retainer cover 1516 covering an acoustic gasket 1520 is connected to the acoustic retainer 1523 by the retainer cover screw 1512. The flanged magnetic gasket 1514 separates the retainer cover 1516 and the acoustic retainer 1523. In between the anchoring point of the attachment means and the door 10 are the EMI gasket 1518 and acoustic gasket 1520. The EMI gasket 1518 may increase the shielding door 10 for EMI shielding when the door 10 is in a closed position by contacting the door 10. The EMI gasket 1518 seals the door 10 when the door 10 is in the closed position. The EMI gasket 1518 may be made of multiple layers, which increase the EMI shielding seal between the head section 1500 and the door 10 and held by an EMI retainer 1526.

Advantageously, the EMI gaskets 1518 included are sized and configured to account for variations in the construction and for variation in wall conditions to mitigate EMI leaks. The acoustical gasket 1520 may be under the acoustic retainer 1523 and the flanged magnetic gasket 1514. The acoustical gasket 1520 may further insulate the head section 1500 and aid in increasing the acoustic attenuation. The acoustical gasket 1520 may be a neoprene sponge or any other similar material. The retainer cover screw 1512 may connect through any one of or all of the retainer cover 1516, flanged magnetic gasket 1514, and acoustical gasket 1520.

Figure 12:
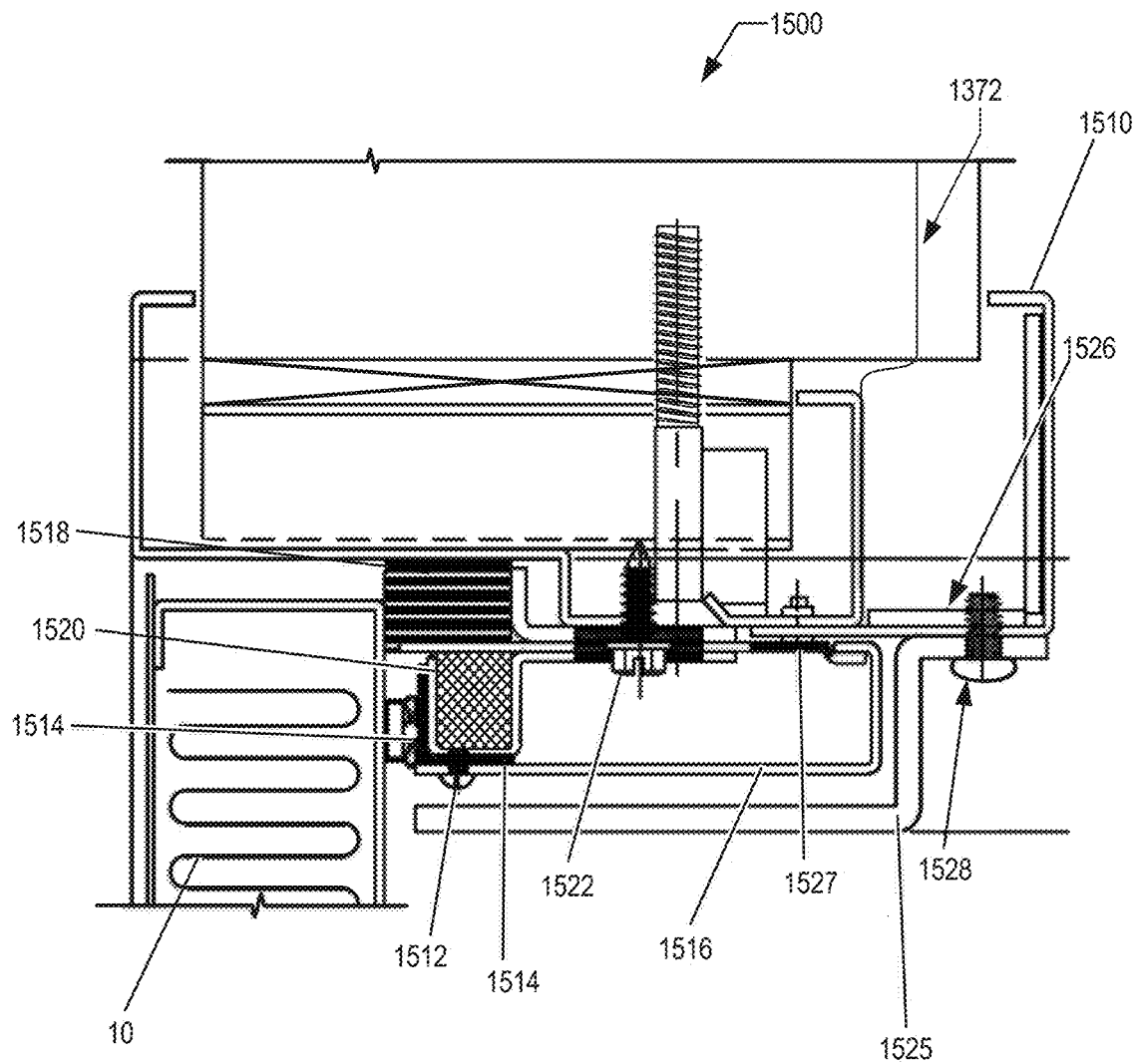
FIG. 12 displays a section view of an example of a head section with a Z bracket.

FIG. 12 displays a cross section of an example of a head section with a Z bracket 1525. The Z bracket 1525 may be configured or shaped to cover the retainer cover 1516. The Z bracket 1525 may be Z-shaped to form against the retainer cover 1516 and mount to the jamb surface with screws 1528 at one end while covering the area of the acoustic gasket 1520 at the other. The Z bracket 1525 may be thicker than the retainer cover 1516. The Z bracket 1525 may screw into an additional plate 1526. A flanged magnetic gasket 1514 may be placed against the retainer cover 1516 and contact the door 10 when the door is in a closed position. The flanged magnetic gasket 1514 may have further sealing and attenuation properties, primarily for acoustical dampening.

Figure 13:
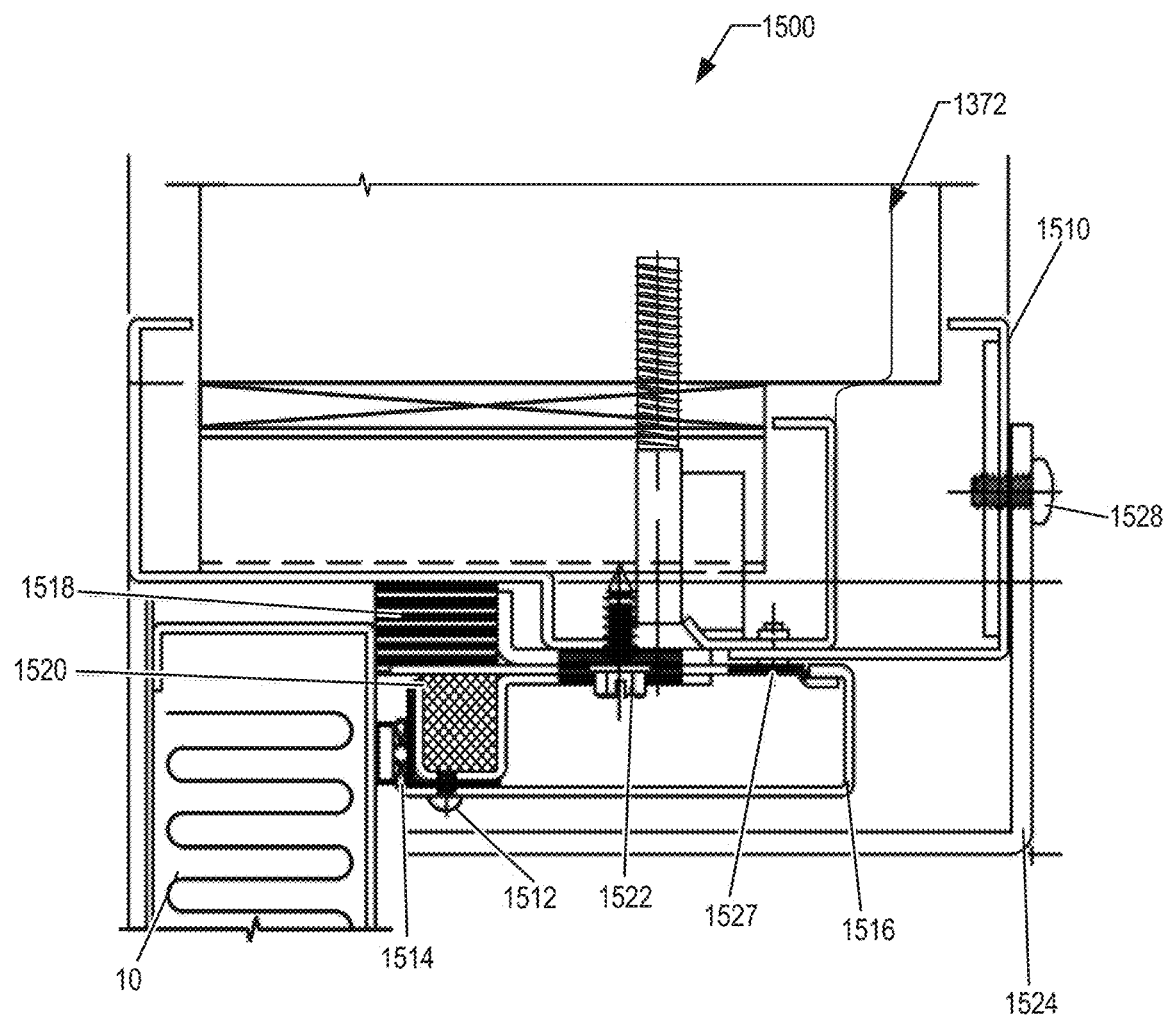
FIG. 13 displays a section view of an example of a head section with an L bracket.

FIG. 13 displays a cross section of an example of a head section with an L bracket 1524. The L bracket may be configured or shaped to at least partially cover the retainer cover 1516. The L bracket 1524 may be L-shaped to form against, or include a spacing, the retainer cover 1516 and mount to the back frame 1510 with at least one screw. The L bracket 1524 may thicker than the retainer cover 1516.

Figure 14A:
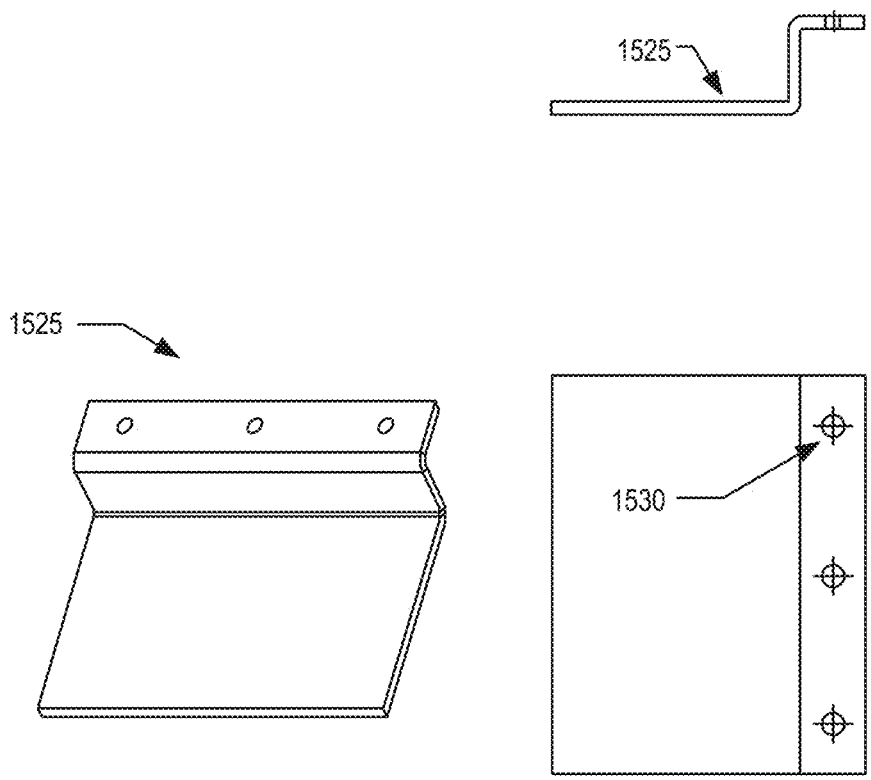
FIG. 14a displays an isometric view and a top view of a closer Z bracket.
Figure 14B:
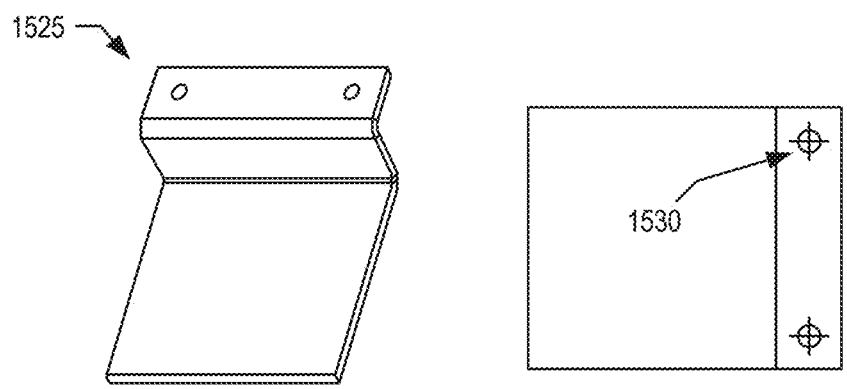
FIG. 14b displays an isometric view and a top view of a strike Z bracket.

FIG. 14a displays an isometric view and a top view of a closer Z bracket 1525. The Z bracket 1525 may have multiple attachment points 1530 for fixing the Z bracket 1525 to the door frame 1000, but preferably three. FIG. 14b displays an isometric view and a top view of a strike Z bracket 1525. The strike Z-bracket 1525 may have multiple attachment points for fixing the strike Z bracket 1525 to the back frame 1312. FIG. 15a displays an isometric view and a top view of a closer L bracket 1524. The L bracket 1524 may have multiple attachment points for fixing the L bracket 1524 to the door frame 1000, but preferably at least two. FIG. 15b displays an isometric view and a top view of a strike L bracket. The strike L bracket 1524 may have multiple attachment points 1530 for fixing the L bracket 1524 to the door frame 1000, but preferably at least two.

The electromagnetic shielding and acoustic attenuation door system may be installed in a door frame. The installation process may include, but is not limited to: packing the main frame with sound attenuating materials; installing the main frame in the rough door frame opening; attaching the main frame to the wall with screws or other attachment means; attaching the permanent spreader bar to the floor space; packing the void between the main frame and wall with sound-attenuating materials; tying the wall shielding onto the main frame; attaching the back frame to the main frame; installing the threshold with the radio frequency gasketing and attaching it to the spreader bar; swinging the door on the frame; installing the radio frequency retainer and gasketing on the frame perimeter; adjusting the seal retainer to come into contact with the face of the door; installing the sound seal retainer on top of the radio frequency retainer seal system; adjusting the sound seal retainer to allow the seal to come into contact with the door face; attaching the retainer cover onto the sound seal retainer; attaching the door bottom into the door and adjusting to contact the threshold; and install L and Z brackets as required for additional hardware after the seal system has been fully adjusted. After finish painting the protective mask will be removed from the perimeter tape around the door.

Advantageously, the frame 1000 and sections which makeup the system are fully adjustable to allow for variation in the construction of the wall to obtain EMI shielding.

Advantageously, the retainers 1320, 1356, 1516, 1523, 1526, 24 that the gaskets 1354, 1334, 1336, 1518, 1514, 1520, 26, 28 are situated in are adjustable to account for variations in the construction and for variation in floor and wall conditions to mitigate EMI leak and sound attenuation under the threshold, jamb, and header.

Advantageously, the threshold 1402 may be a one half inch high stainless steel threshold, which allows users to clear the carpet or flooring material under the door as it opens to 90 degrees.

Advantageously, the permeant spreader bar 1406 under the threshold 1402 makes the threshold more resistant to becoming crushed when heavy equipment is taken over the threshold 1402. It also helps resist twisting the door frame 1000 during installation.

Whereas, the invention has been described in relation to the drawings and claims, it should be understood that other and further modifications, apart from those shown or suggested herein, may be made within the scope of this invention.

The invention claimed is:

1. An EMI shielding and acoustic attenuation door frame and door system, comprising:
 a door connected to a door frame with a hinge, the door comprising a bottom portion having a plate, a door gasket, a door sponge, and conductive tape for grounding the door;
 the door frame comprising:
  a jamb section comprising:
   a jamb main frame;
   a jamb back frame; wherein the jamb main frame and back frame being adjustable along the door;
   a layered jamb gasket at least partially in between the door and the jamb main frame;
   a flanged magnetic jamb gasket fixed to an acoustical retainer with a fastener; wherein the door is grounded when the door is in a closed position against the door frame;
  a sill section comprising:
   a spreader bar having at least one sill gasket covered by a threshold, the spreader bar and at least one sill gasket contacting a floor shielding; and
  a door head section comprising:
   the conductive tape contacting a head EMI gasket, the head EMI gasket fixed to a head main frame; wherein the head EMI gasket at least partially contacts the door when the door is in a closed position.

2. The EMI shielding and acoustic attenuation door frame and door of claim 1, wherein:
 the jamb section further comprises a jamb EMI retainer adjustably fixed to the jamb main frame, the jamb EMI retainer configured for the jamb EMI gasket to be fixed to; and
 the head section further comprises a head retainer frame adjustably fixed to the head main frame, the head retainer frame configured for a head acoustical gasket to be fixed to therein; and a head cover, the head cover adjustably fixed to the head main frame.

3. The EMI shielding and acoustic attenuation door frame and door of claim 2, wherein the jamb EMI gasket is a layered gasket having three layers which contact the jamb main frame and the door.

4. The EMI shielding and acoustic attenuation door frame and door of claim 1, further comprising a bolt which fixes the door frame to a wall, the bolt inserted at least partially in the wall and through the door frame.

5. The EMI shielding and acoustic attenuation door frame and door of claim 1, wherein the hinge rotatably fixing the door to the frame is a cam lift hinge.

6. The EMI shielding and acoustic attenuation door frame and door of claim 1, wherein the jamb back frame is adjustable such that the jamb main frame is secured to a wall.

7. The EMI shielding and acoustic attenuation door frame and door of claim 1, wherein the door EMI gasket and the door sponge at least partially contact the threshold when the door is in the closed position.

8. The EMI shielding and acoustic attenuation door frame and door of claim 1, wherein the door EMI gasket is at least partially in between a steel plate and the door sponge.

9. The EMI shielding and acoustic attenuation door frame and door of claim 1, wherein the door EMI gasket is a two-piece layered gasket.

10. An EMI shielding and acoustic attenuation door frame, comprising:
 a door jamb section comprising:
  a main door frame fixed to a wall, a jamb back frame adjustably fixed to the main frame and a jamb EMI retainer, the jamb EMI retainer adjustably fixed to the jamb main frame;
  a jamb acoustic gasket in between the main frame and an acoustic retainer fixed to the main frame; and
  a flanged magnetic gasket fixed to the acoustic retainer and grounded to the jamb acoustic gasket through a conductive tape;
  wherein the conductive tape is fixed to the door and main door frame;
 a jamb strike section comprising:
  a jamb main frame;
  a jamb back frame; wherein the jamb strike main frame and back frame being adjustable along the main frame;
  a layered jamb gasket at least partially against the jamb main frame;
 a door sill section comprising:
  a spreader bar having at least one sill gasket in between a threshold and a floor surface; and
 a door head section comprising:
  a door head frame comprising a head back frame and a head retainer cover adjustably fixed to the head main frame; and
  the conductive tape at least partially contacting a head gasket;

a flanged magnetic head gasket fixed to head retainer cover and fixed to the conductive tape.

11. The EMI shielding and acoustic attenuation door frame of claim 10, further comprising:
a door rotatably connected to the door frame with the at least one hinge, the door comprising a bottom portion having a plate, a door gasket, a door sponge, and the conductive tape.

12. The EMI shielding and acoustic attenuation door frame of claim 11, wherein when the door is in a closed position, the jamb gaskets and the head gaskets at least partially contact the door.

13. The EMI shielding and acoustic attenuation door frame of claim 11, wherein the door gasket and the door sponge contact the threshold when the door is in the closed position.

14. The EMI shielding and acoustic attenuation door frame of claim 11, wherein the door gasket separates the plate and the door sponge.

15. The EMI shielding and acoustic attenuation door frame of claim 11, wherein the door gasket is a layered gasket.

16. The EMI shielding and acoustic attenuation door frame of claim 10, wherein the jamb gasket is a layered gasket having three layers which contact the jamb retainer frame and a door.

17. The EMI shielding and acoustic attenuation door frame of claim 10, the layered jamb strike gasket at least partially contacts the door when the door is in a closed position.

18. The EMI shielding and acoustic attenuation door frame of claim 10, further comprising a fastener which fixes the door frame to a wall, the fastener inserted at least partially in the wall and through the door frame.

19. The EMI shielding and acoustic attenuation door frame of claim 10, wherein the hinge rotatably fixing a door to the frame is a cam lift hinge.

20. The EMI shielding and acoustic attenuation door frame of claim 10, the jamb back frame being adjustable such that acoustical and EMI retainers are adjustably fixed to the main jamb frame.

* * * * *